(12) United States Patent
Liu et al.

(10) Patent No.: US 10,573,842 B2
(45) Date of Patent: Feb. 25, 2020

(54) ORGANIC ELECTROLUMINESCENT DEVICE, METHOD FOR MANUFACTURING THE SAME AND DISPLAY DEVICE

(71) Applicants: BOE TECHNOLOGY GROUP CO., LTD., Beijing (CN); Chengdu BOE Optoelectronics Technology Co., Ltd., Chengdu, Sichuan Province (CN)

(72) Inventors: Yangsheng Liu, Beijing (CN); Hwang Kim, Beijing (CN)

(73) Assignees: BOE TECHNOLOGY GROUP CO., LTD., Beijing (CN); CHENGDU BOE OPTOELECTRONICS TECHNOLOGY CO. LTD., Chengdu, Sichuan Province (CN)

( * ) Notice: Subject to any disclaimer, the term of this patent is extended or adjusted under 35 U.S.C. 154(b) by 0 days.

(21) Appl. No.: 15/975,752

(22) Filed: May 9, 2018

(65) Prior Publication Data

US 2019/0131563 A1 May 2, 2019

(30) Foreign Application Priority Data

Oct. 26, 2017 (CN) .......................... 2017 1 1012985

(51) Int. Cl.
*H01L 51/52* (2006.01)
*H01L 27/32* (2006.01)
(Continued)

(52) U.S. Cl.
CPC ...... *H01L 51/5209* (2013.01); *H01L 51/0023* (2013.01); *H01L 51/5237* (2013.01); *H01L 51/56* (2013.01); *H01L 27/3246* (2013.01)

(58) Field of Classification Search
CPC ............. H01L 51/5209; H01L 51/5237; H01L 51/0023; H01L 51/56; H01L 27/3246
(Continued)

(56) References Cited

U.S. PATENT DOCUMENTS

2014/0292622 A1* 10/2014 Lee .................... H01L 27/3216
257/71
2015/0206927 A1 7/2015 Kuroda et al.
(Continued)

FOREIGN PATENT DOCUMENTS

CN 104282844 A 1/2015
CN 104396345 A 3/2015
(Continued)

OTHER PUBLICATIONS

English machine translation of Chinese Patent CN104282844 (A) by Zeng Ying Xiang Date: Jan. 14, 2015, (Year: 2015).*
(Continued)

*Primary Examiner* — Thinh T Nguyen
(74) *Attorney, Agent, or Firm* — Kinney & Lange, P.A.

(57) ABSTRACT

An organic electroluminescent device, a method for manufacturing the same, and a display device. The organic electroluminescent device includes: a base substrate comprising a plurality of pixel regions thereon; a pixel electrode layer; a planarization layer, formed with a protrusion on a surface of the planarization layer facing away from the base substrate and at a position corresponding to at least one side edge of a periphery of each pixel region; an anode layer, the anode layer being electrically connected to the pixel electrode layer through a via hole, and the anode layer covering the pixel region and covering a side surface of the protrusion facing the pixel region; a light emitting layer, a height of a surface of the light emitting layer being less than a height of the anode layer covering the side surface of the protrusion; a pixel definition layer; and a cathode layer.

17 Claims, 2 Drawing Sheets

(51) Int. Cl.
  *H01L 51/00* (2006.01)
  *H01L 51/56* (2006.01)

(58) Field of Classification Search
  USPC .............. 257/40, 72, 81; 438/22, 24, 82, 99
  See application file for complete search history.

(56) References Cited

U.S. PATENT DOCUMENTS

2016/0079570 A1  3/2016  Kim et al.
2018/0331325 A1  11/2018  Zhang

FOREIGN PATENT DOCUMENTS

CN    105514144 A    4/2016
CN    1067839528 A   5/2017
CN    106941113 A    7/2017

OTHER PUBLICATIONS

Chinese Office Action dated Dec. 18, 2018, received for corresponding Chinese Application No. 201711012985.X.
Second Chinese Office Action dated Aug. 8, 2019, received for corresponding Chinese Application No. 201711012985.X.
Chinese Search Report dated Aug. 1, 2019, received for corresponding Chinese Application No. 201711012985.X.
Third Chinese Office Action dated Dec. 30, 2019, received for corresponding Chinese Application No. 201711012985.X, including Chinese Search Report dated Dec. 19, 2019.

* cited by examiner

ORGANIC ELECTROLUMINESCENT DEVICE, METHOD FOR MANUFACTURING THE SAME AND DISPLAY DEVICE

CROSS-REFERENCE TO RELATED APPLICATION

This application claims the benefit of Chinese Patent Application No. 201711012985.X filed on Oct. 26, 2017 in the State Intellectual Property Office of China, the disclosure of which is incorporated herein by reference in entirety.

BACKGROUND

Technical Field

Embodiments of the present disclosure relate to the field of display technology, and in particular, to an organic electroluminescent device, a method for manufacturing an organic electroluminescent device, and a display device.

Description of the Related Art

An Organic Light-Emitting Diode (OLED) display, also known as organic electroluminescent display, is an emerging flat panel display device. Since an OLED display device has some advantages compared with an LCD display device, such as self-luminescence, simple structure, low cost, fast response speed, wide viewing angle, high color saturation, high contrast, lightness and thinness, flexibility, etc., more and more smart phones and wearable devices start to use an OLED display device.

An OLED device generally includes a substrate, and an anode, a hole injection layer, a hole transport layer, a light emitting layer, an electron transport layer, an electron injection layer and a cathode sequentially disposed on the substrate. The light emitting principle of the OLED device is that a semiconductor material and an organic light emitting material are made to emit light, with driven by an electric field through carrier injection and recombination. In the related art, with the emergence of phosphorescent materials, an internal quantum efficiency of the OLED is almost 100%, and due to absorption of functional layers and electric layer materials constituting the device and a large part of the waveguide modes and substrate modes, an external quantum efficiency is limited, therefore, a large amount of energy is lost inside the device.

SUMMARY

Embodiments of the present disclosure provide an organic electroluminescent device, a method for manufacturing the same, and a display device. A bending structure is formed in a portion of an anode layer of the organic electroluminescent device corresponding to a pixel region. In this way, it can increase an internal reflection efficiency of the display device, increase a light out-coupling efficiency, and it can prevent pixel light from leaking from side surfaces, reduce a risk of color mixing, and improve display quality.

An organic electroluminescent device, comprising:
a base substrate comprising a plurality of pixel regions thereon;
a pixel electrode layer on the base substrate;
a planarization layer on the pixel electrode layer, formed with a protrusion on a surface of the planarization layer facing away from the base substrate and at a position corresponding to at least one side edge of a periphery of each pixel region;
an anode layer on the planarization layer, the anode layer being electrically connected to the pixel electrode layer through a via hole, and the anode layer covering the pixel region and covering a side surface of the protrusion facing the pixel region;
a light emitting layer on the anode layer and opposite to the pixel region, a height of a surface of the light emitting layer being less than a height of the anode layer covering the side surface of the protrusion;
a pixel definition layer around each pixel region; and
a cathode layer on the light emitting layer and the pixel definition layer.

Optionally, protrusions are formed on the surface of the planarization layer facing away from the base substrate and at positions corresponding to various side edges of the periphery of each pixel region, and two adjacent protrusions forming a recess structure therebetween.

Optionally, the anode layer comprises a bending structure, the bending structure being angled with respect to a portion of the anode layer covering the pixel region.

Optionally, the anode layer covering the side surface of the protrusion extends to a top end of the protrusion and covers a top surface of the protrusion.

Optionally, the anode layer comprises:
a first portion covering the pixel region;
a bending structure, the bending structure being angled with respect to the first portion; and
a second portion covering a top surface of the protrusion.

Optionally, a side surface of the protrusion covered by the anode layer is an inclined surface and the inclined surface has a top side inclined away from the pixel region.

Optionally, the bending structure of the anode layer is matched with the inclined surface in shape.

Optionally, a side surface of the protrusion covered by the anode layer is an arc-shaped concave surface.

Optionally, the bending structure of the anode layer is matched with the arc-shaped concave surface in shape.

Optionally, the pixel definition layer covers an edge portion of the anode layer outside the pixel region.

An embodiment of the present disclosure further provides a display device, comprising the organic electroluminescent device according to any one of the above technical solutions.

An embodiment of the present disclosure further provides a method for manufacturing the organic electroluminescent device according to any one of the above technical solutions, the method comprising:
forming a pixel electrode layer on a base substrate;
forming a planarization layer on the pixel electrode layer, and forming a pattern of the planarization layer by a patterning process, wherein a protrusion is formed on a surface of the planarization layer facing away from the base substrate and at a position corresponding to at least one side edge of a periphery of each pixel region; and forming a via hole in the planarization layer for being communicated with the pixel electrode layer;
forming an anode layer on the planarization layer, and forming a pattern of the anode layer by a patterning process, wherein the anode layer is electrically connected to the pixel electrode layer through the via hole, and the anode layer covers the pixel region and covers a side surface of the protrusion facing the pixel region;
forming a light emitting layer on the anode layer, the light emitting layer being opposite to the pixel region, a height of a surface of the light emitting layer being less than a height of the anode layer covering the side surface of the protrusion;

forming a pixel definition layer around each pixel region; and forming a cathode layer on the light emitting layer and the pixel definition layer.

Optionally, the planarization layer is formed with the pattern of the planarization layer by a semi-transparent mask patterning process.

Optionally, the semi-transparent mask patterning process comprises:

coating a photoresist layer on the planarization layer;

exposing and developing the photoresist layer by an exposing process, wherein a portion of the planarization layer corresponding to the via hole is fully exposed to a light, and a portion of the planarization layer corresponding to the protrusion is unexposed to the light, and the remaining portion of the planarization layer is half-exposed to the light;

performing a first etching to the portion of the planarization layer corresponding to the via hole, and removing the portion of the planarization layer corresponding to the via hole to form the via hole;

performing an ashing treatment to the photoresist in such a way that a certain thickness of the photoresist in the planarization layer corresponding to the protrusion is maintained and all other photoresist in the planarization layer other than the photoresist corresponding to the protrusion is removed;

performing a second etching to the planarization layer to partially remove a portion of the planarization layer other than the portion corresponding to the via hole and the protrusion, to form the protrusion; and removing the photoresist corresponding to the protrusion.

DETAILED DESCRIPTION OF PREFERRED EMBODIMENTS

Next, the technical solutions in the embodiments of the present disclosure will be clearly and completely described with reference to the accompanying drawings in the embodiments of the present disclosure. Apparently, the described embodiments are merely a part of the embodiments of the present disclosure, but not all of the embodiments. All other embodiments obtained by those skilled in the art based on the embodiments of the present disclosure without any creative efforts shall fall within the scope of the present disclosure.

Figure 1:
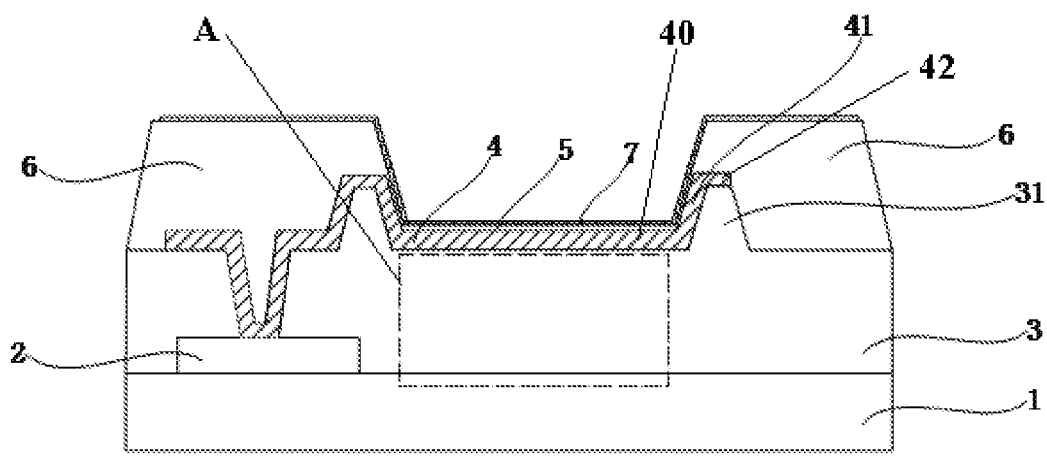
FIG. 1 is a schematic cross-sectional view of a functional film layer of an organic electroluminescent device according to an embodiment of the present disclosure.

Referring to FIG. 1, an organic electroluminescent device according to an embodiment of the present disclosure includes a base substrate 1 including a plurality of pixel regions A thereon. The organic electroluminescent device further includes: a pixel electrode layer 2 formed on the base substrate 1; a planarization layer 3 formed on the pixel electrode layer 2, a protrusion 31 being formed on a surface of the planarization layer 3 facing away from the base substrate 1 and at a position corresponding to at least one side edge of a periphery of each pixel region, for example, the protrusion 31 being formed on an upper surface of the planarization layer 3 and outside a side edge of a periphery of each pixel region; an anode layer 4 formed on the planarization layer 3, the anode layer 4 being electrically connected to the pixel electrode layer through a via hole 32, and the anode layer 4 covering the pixel region and covering a side surface of the protrusion 31 facing the pixel region; a light emitting layer 5 formed on the anode layer 4 and opposite to the pixel region, a height of a surface of the light emitting layer 5 being less than a height of the anode layer 4 covering the side surface of the protrusion 31; a pixel definition layer 6 formed around each pixel region; and a cathode layer 7 formed on the light emitting layer 5 and the pixel definition layer 6.

In the organic electroluminescent device described above, the base substrate 1 includes a plurality of pixel regions thereon. In this embodiment, only one pixel region is shown. A protrusion 31 is formed on a surface of the planarization layer 3 facing away from the base substrate 1 and at a portion corresponding to at least one side edge of a periphery of the pixel region. The anode layer 4 is formed on the planarization layer 3. The anode layer 4 covers the pixel region, and covers a side surface of the protrusion 31 facing the pixel region, then a portion of the anode layer 4 covering the side surface of the protrusion 31 facing the pixel region forms a bending structure 41 with respect to a portion corresponding to the pixel region, that is, forming the bending structure with respect to a portion of the anode layer 4 covering the pixel region. The bending structure forms an angle with respect to the portion of the anode layer covering the pixel region. The light emitting layer 5 is formed on the anode layer 4, and the light emitting layer 5 is disposed on the anode layer 4 at a position corresponding to the pixel region, for example, on a portion of the anode layer 4 covering the pixel region, and a height of a surface of the light emitting layer 5 is less than a height of the bending structure 41 of the anode layer 4. When the above organic electroluminescent device is energized, the light emitting layer 5 emits light, and the anode layer 4 reflects the light, then the light is emitted from a side where the cathode layer 7 is located, to form a display screen, and the light is emitted from the pixel region. In this embodiment, the direction from the anode layer 4 to the cathode layer 7 is an emitting direction of the light. For purpose of description, it is specified that the direction from the anode layer 4 to the cathode layer 7 perpendicularly is a positive direction, and a direction deviating from the positive direction is an oblique direction. When the light emitting layer 5 emits light, the emitting direction of the light emitted from the light emitting layer 5 is within a certain range. The light emitted from the light emitting layer 5 towards the side surface is obliquely illuminated onto a surface of the bending structure 41. The bending structure 41 reflects the light obliquely emitted from the light emitting layer 5, so that the light obliquely emitted from the light emitting layer 5 is emitted from the side of the cathode layer 7 after being reflected. That is, the light emitted from the side surface of the light emitting layer 5 is reflected by the bending structure 41 of the anode layer 4 and then is emitted from the front side of the light emitting layer, it can increase the internal reflection efficiency of the organic electroluminescent device according to this embodiment. Moreover, the bending structure 41 in the anode layer 4 reflects the light emitted from the side surface of the light emitting layer 5 so that the light is emitted from the front side of the pixel region, to prevent the light from passing through the pixel definition layer 6 from the side surface. In this way, it prevents the occurrence of color mixing, increases a contrast of a display device using the above organic electroluminescent device, and improves display quality.

Therefore, the bending structure 41 is formed at a side edge of a portion corresponding to the pixel region in the anode layer 4 of the organic electroluminescent device, it can increase the internal reflection efficiency of the display device, increase the light out-coupling efficiency, and it can prevent the pixel light from leaking from the side surfaces, reduce the risk of color mixing, and improve the display quality of the display device.

Figure 3:
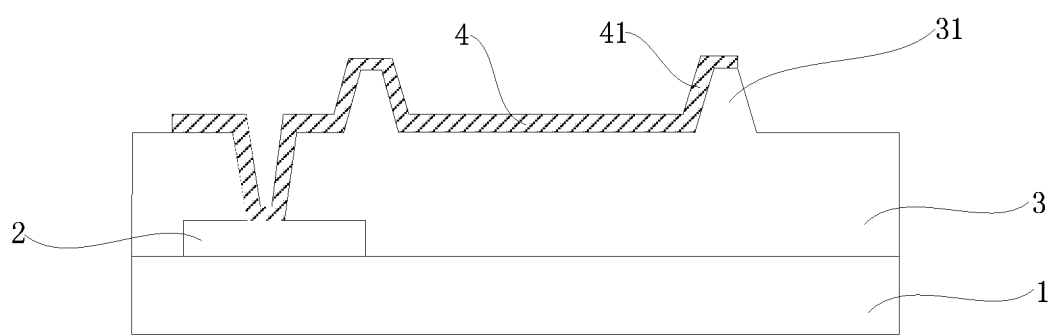
FIG. 3 is a schematic cross-sectional view of an anode layer according to an embodiment of the present disclosure.

As shown in FIG. 3, specifically, protrusions 31 are formed on the surface of the planarization layer 3 facing away from the base substrate 1 and at positions corresponding to various side edges of the periphery of each pixel region, and two adjacent protrusions 31 forming a recess structure therebetween. For example, a peripheral protrusion 31 is formed around a portion corresponding to the pixel region in the planarization layer 3, the protrusion surrounds a portion opposing to the pixel region, to form a recess structure, and the anode layer 4 is formed on the planarization layer 3 in conformity with the recess structure in the planarization layer 3. Then, a periphery of the portion of the anode layer 4 corresponding to the pixel region (the portion of the anode layer 4 covering the pixel region) forms the bending structure 41, and two adjacent bending structures 41 are connected to each other. When the light emitting layer 5 emits light, the light emitted from the light emitting layer 5 towards the periphery of the light emitting layer 5 is reflected by the bending structure 41 and then is emitted from the front side, thereby the internal reflection efficiency of the organic electroluminescent device is better, the light out-coupling efficiency is higher, and it facilitates avoiding the occurrence of color mixing and increasing the contrast of the display device.

It should be noted that, in the side edges of the periphery of each pixel region and in the surface of the planarization layer 3 facing away from the base substrate 1, protrusions 31 may be provided on two or three side edges, however the embodiments of the present disclosure will not be limited thereto.

Specifically, the anode layer 4 covering the side surface of the protrusion 31 extends to a top end of the protrusion 31 and covers a top surface of the protrusion 31. Increasing a reflective area of the anode layer 4 for the light emitted from the side surface of the light emitting layer 5 is beneficial to increase the reflection efficiency of the anode layer 4. Correspondingly, the anode layer includes a first portion 40 covering the pixel region; a bending structure 41, the bending structure forming an angle with respect to the first portion; and a second portion 42 covering a top surface of the protrusion, as shown in FIG. 1.

Specifically, the side surface of the protrusion 31 covered by the anode layer 4 is an inclined surface. A top side of the inclined surface is inclined away from the pixel region, the cross section of the protrusion 31 perpendicular to the side surface of the protrusion 31 is trapezoidal, and the bending structure of the anode layer is matched with the inclined surface in shape. That is, the bending structure 41 in the anode layer 4 is inclined, so that a reflective surface of the bending structure 41 of the anode layer 4 is deflected towards the front-side emitting direction, which facilitates the reflection of the bending structure 41 of the anode layer 4 to the light emitted from the side surface of the light emitting layer 5, to form light which is emitted from the front side. In this way, it facilitates increasing the internal reflection efficiency of the organic electroluminescent device according to this embodiment, thereby further increasing the light out-coupling efficiency of the organic electroluminescent device according to this embodiment.

Figure 4:
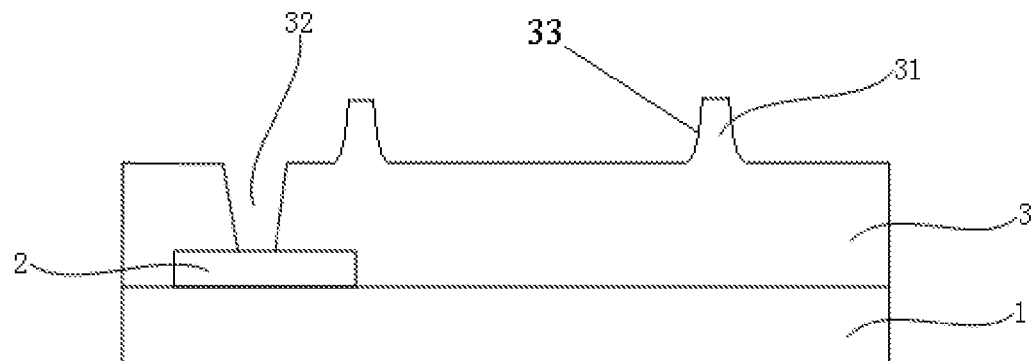
FIG. 4 is a schematic cross-sectional view of a planarization layer formed with a protrusion according to another embodiment of the present disclosure.

Specifically, the side surface of the protrusion 31 covered by the anode layer 4 is an arc-shaped concave surface 33, as shown in FIG. 4, the bending structure of the anode layer is matched with the arc-shaped concave surface in shape. The arc-shaped concave surface 33 has a better reflection effect on the light from the side surface, and further facilitates increasing the light out-coupling efficiency of the organic electroluminescent device according to this embodiment.

Specifically, the pixel definition layer 6 covers an edge portion of the anode layer 4 outside the pixel region.

An embodiment of the present disclosure also provides a display device including the organic electroluminescent device according to any one of the above embodiments.

In addition, an embodiment of the present disclosure further provides a method for manufacturing the organic electroluminescent device according to any one of the above embodiments. The method includes: forming a pixel electrode layer 2 on a base substrate 1; forming a planarization layer 3 on the pixel electrode layer 2, and forming a pattern of the planarization layer by a patterning process. A protrusion 31 is formed on a surface of the planarization layer 3 facing away from the base substrate 1 and at a position corresponding to at least one side edge of a periphery of each pixel region; and forming a via hole 32 in the planarization layer 3 for being communicated with the pixel electrode layer; forming an anode layer 4 on the planarization layer 3, and forming a pattern of the anode layer 4 by a patterning process. The anode layer 4 is electrically connected to the pixel electrode layer through the via hole 32, and the anode layer 4 covers the pixel region and covers a side surface of the protrusion 31 facing the pixel region; forming a light emitting layer 5 on the anode layer 4, the light emitting layer being opposite to the pixel region, a height of a surface of the light emitting layer 5 being less than a height of the anode layer 4 covering the side surface of the protrusion 31; forming a pixel definition layer 6 around each pixel region; and forming a cathode layer 7 on the light emitting layer 5 and the pixel definition layer 6.

In the organic electroluminescent device manufactured by the above manufacturing method, the bending structure 41 is formed at a side edge of a portion corresponding to the pixel region in the anode layer 4, it can increase the internal reflection efficiency of the display device, increase the light out-coupling efficiency, and it can prevent the pixel light from leaking from the side surfaces, reduce the risk of color mixing, and improve the display quality of the display device.

In the above manufacturing method, the planarization layer 3 is formed with the pattern of the planarization layer by a semi-transparent mask patterning process.

Figure 2:
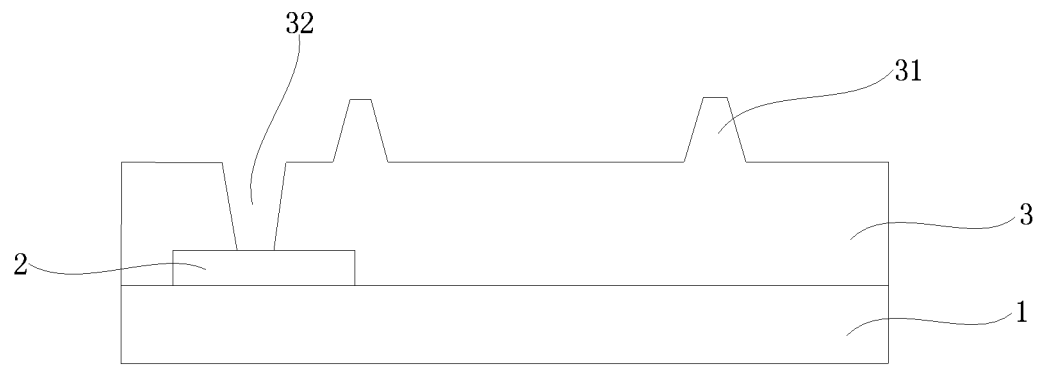
FIG. 2 is a schematic cross-sectional view of a planarization layer formed with a protrusion according to an embodiment of the present disclosure.

Specifically, the above semi-transparent mask patterning process includes: coating a photoresist layer on the planarization layer 3; exposing and developing the photoresist layer by an exposing process, wherein a portion of the planarization layer 3 corresponding to the via hole 32 is fully exposed to a light, and a portion of the planarization layer 3 corresponding to the protrusion 31 is not exposed to the light, and the remaining portion of the planarization layer 3 is half-exposed to the light; performing a first etching to the portion of the planarization layer 3 corresponding to the via hole 32, and removing the portion of the planarization layer 3 corresponding to the via hole 32 to form the via hole 32; performing an ashing treatment to the photoresist in such a way that a certain thickness of the photoresist in the planarization layer 3 corresponding to the protrusion 31 is maintained and all other photoresist in the planarization layer 3 other than the photoresist corresponding to the protrusion 31 is removed; performing a second etching to the planarization layer 3, as shown in FIG. 2, to partially remove a portion of the planarization layer 3 other than the portion corresponding to the via hole 32 and the protrusion 31, to form the protrusion 31; and removing the photoresist corresponding to the protrusion 31. In the above semi-transparent mask patterning process, the via hole 32 and the protrusion 31 are completed using one half-exposure process and subsequent processes, which simplifies process flow and reduces manufacture cost.

It will be apparent that various modifications and variations can be made by those skilled in the art to the embodiments of the present disclosure without departing from the spirit and scope of the present disclosure. Thus, if these modifications and variations to the present disclosure fall within the scope of the claims of the present disclosure and equivalents thereof, the present disclosure is also intended to include these modifications and variations.

What is claimed is:

1. An organic electroluminescent device, comprising:
    a base substrate comprising a plurality of pixel regions thereon;
    a pixel electrode layer on the base substrate;
    a planarization layer on the pixel electrode layer, formed with a protrusion on a surface of the planarization layer facing away from the base substrate and at a position corresponding to at least one side edge of a periphery of each pixel region;
    an anode layer on the planarization layer, the anode layer being electrically connected to the pixel electrode layer through a via hole, and the anode layer covering the pixel region and covering a side surface of the protrusion facing the pixel region;
    a light emitting layer on the anode layer and opposite to the pixel region, a height of a surface of the light emitting layer being less than a height of the anode layer covering the side surface of the protrusion;
    a pixel definition layer around each pixel region; and
    a cathode layer on the light emitting layer and the pixel definition layer,
    wherein the side surface of the protrusion covered by the anode layer is an arc-shaped concave surface.

2. The organic electroluminescent device according to claim 1, wherein a plurality of protrusions are formed on the surface of the planarization layer facing away from the base substrate and at positions corresponding to various side edges of the periphery of each pixel region, and two adjacent protrusions form a recess structure therebetween.

3. The organic electroluminescent device according to claim 1, wherein the anode layer comprises a bending structure, the bending structure being angled with respect to a portion of the anode layer covering the pixel region.

4. The organic electroluminescent device according to claim 1, wherein the anode layer covering the side surface of the protrusion extends to a top end of the protrusion and covers a top surface of the protrusion.

5. The organic electroluminescent device according to claim 1, wherein the anode layer comprises:
    a first portion covering the pixel region;
    a bending structure, the bending structure being angled with respect to the first portion; and
    a second portion covering a top surface of the protrusion.

6. The organic electroluminescent device according to claim 3, wherein the bending structure of the anode layer has a shape that matches with the arc-shaped concave surface.

7. The organic electroluminescent device according to claim 1, wherein the pixel definition layer covers an edge portion of the anode layer outside the pixel region.

8. A display device, comprising the organic electroluminescent device according to claim 1.

9. A method for manufacturing the organic electroluminescent device according to claim 1, the method comprising:
    forming a pixel electrode layer on a base substrate;
    forming a planarization layer on the pixel electrode layer, and forming a pattern of the planarization layer by a patterning process, wherein a protrusion is formed on a surface of the planarization layer facing away from the base substrate and at a position corresponding to at least one side edge of a periphery of each pixel region; and forming a via hole in the planarization layer for being communicated with the pixel electrode layer;
    forming an anode layer on the planarization layer, and forming a pattern of the anode layer by a patterning process, wherein the anode layer is electrically connected to the pixel electrode layer through the via hole, and the anode layer covers the pixel region and covers a side surface of the protrusion facing the pixel region;
    forming a light emitting layer on the anode layer, the light emitting layer being opposite to the pixel region, a height of a surface of the light emitting layer being less than a height of the anode layer covering the side surface of the protrusion;
    forming a pixel definition layer around each pixel region; and
    forming a cathode layer on the light emitting layer and the pixel definition layer.

10. The method according to claim 9, wherein the planarization layer is formed with the pattern of the planarization layer by a semi-transparent mask patterning process.

11. The method according to claim 10, wherein the semi-transparent mask patterning process comprises:
    coating a photoresist layer on the planarization layer;
    exposing and developing the photoresist layer by an exposing process, wherein a portion of the planarization layer corresponding to the via hole is fully exposed to a light, and a portion of the planarization layer corresponding to the protrusion is unexposed to the light, and the remaining portion of the planarization layer is half-exposed to the light;
    performing a first etching to the portion of the planarization layer corresponding to the via hole, and removing the portion of the planarization layer corresponding to the via hole to form the via hole;
    performing an ashing treatment to the photoresist in such a way that a certain thickness of the photoresist in the planarization layer corresponding to the protrusion is maintained and all other photoresist in the planarization layer other than the photoresist corresponding to the protrusion is removed;
    performing a second etching to the planarization layer to partially remove a portion of the planarization layer other than the portion corresponding to the via hole and the protrusion, to form the protrusion; and
    removing the photoresist corresponding to the protrusion.

12. A method for manufacturing the organic electroluminescent device according to claim 2, the method comprising:

forming a pixel electrode layer on a base substrate;
forming a planarization layer on the pixel electrode layer, and forming a pattern of the planarization layer by a patterning process, wherein a protrusion is formed on a surface of the planarization layer facing away from the base substrate and at a position corresponding to at least one side edge of a periphery of each pixel region; and forming a via hole in the planarization layer for being communicated with the pixel electrode layer;
forming an anode layer on the planarization layer, and forming a pattern of the anode layer by a patterning process, wherein the anode layer is electrically connected to the pixel electrode layer through the via hole, and the anode layer covers the pixel region and covers a side surface of the protrusion facing the pixel region;
forming a light emitting layer on the anode layer, the light emitting layer being opposite to the pixel region, a height of a surface of the light emitting layer being less than a height of the anode layer covering the side surface of the protrusion;
forming a pixel definition layer around each pixel region; and
forming a cathode layer on the light emitting layer and the pixel definition layer.

13. The method according to claim 12, wherein the planarization layer is formed with the pattern of the planarization layer by a semi-transparent mask patterning process.

14. The method according to claim 13, wherein the semi-transparent mask patterning process comprises:
coating a photoresist layer on the planarization layer;
exposing and developing the photoresist layer by an exposing process, wherein a portion of the planarization layer corresponding to the via hole is fully exposed to a light, and a portion of the planarization layer corresponding to the protrusion is unexposed to the light, and the remaining portion of the planarization layer is half-exposed to the light;
performing a first etching to the portion of the planarization layer corresponding to the via hole, and removing the portion of the planarization layer corresponding to the via hole to form the via hole;
performing an ashing treatment to the photoresist in such a way that a certain thickness of the photoresist in the planarization layer corresponding to the protrusion is maintained by and all other photoresist in the planarization layer other than the photoresist corresponding to the protrusion is removed;
performing a second etching to the planarization layer to partially remove a portion of the planarization layer other than the portion corresponding to the via hole and the protrusion, to form the protrusion; and
removing the photoresist corresponding to the protrusion.

15. A method for manufacturing the organic electroluminescent device according to claim 3, the method comprising:
forming a pixel electrode layer on a base substrate;
forming a planarization layer on the pixel electrode layer, and forming a pattern of the planarization layer by a patterning process, wherein a protrusion is formed on a surface of the planarization layer facing away from the base substrate and at a position corresponding to at least one side edge of a periphery of each pixel region; and forming a via hole in the planarization layer for being communicated with the pixel electrode layer;
forming an anode layer on the planarization layer, and forming a pattern of the anode layer by a patterning process, wherein the anode layer is electrically connected to the pixel electrode layer through the via hole, and the anode layer covers the pixel region and covers a side surface of the protrusion facing the pixel region;
forming a light emitting layer on the anode layer, the light emitting layer being opposite to the pixel region, a height of a surface of the light emitting layer being less than a height of the anode layer covering the side surface of the protrusion;
forming a pixel definition layer around each pixel region; and
forming a cathode layer on the light emitting layer and the pixel definition layer.

16. The method according to claim 15, wherein the planarization layer is formed with the pattern of the planarization layer by a semi-transparent mask patterning process.

17. The method according to claim 16, wherein the semi-transparent mask patterning process comprises:
coating a photoresist layer on the planarization layer;
exposing and developing the photoresist layer by an exposing process, wherein a portion of the planarization layer corresponding to the via hole is fully exposed to a light, and a portion of the planarization layer corresponding to the protrusion is unexposed to the light, and the remaining portion of the planarization layer is half-exposed to the light;
performing a first etching to the portion of the planarization layer corresponding to the via hole, and removing the portion of the planarization layer corresponding to the via hole to form the via hole;
performing an ashing treatment to the photoresist in such a way that a certain thickness of the photoresist in the planarization layer corresponding to the protrusion is maintained and all other photoresist in the planarization layer other than the photoresist corresponding to the protrusion is removed;
performing a second etching to the planarization layer to partially remove a portion of the planarization layer other than the portion corresponding to the via hole and the protrusion, to form the protrusion; and
removing the photoresist corresponding to the protrusion.

* * * * *